US009685814B1

(12) United States Patent
Moyer et al.

(10) Patent No.: US 9,685,814 B1
(45) Date of Patent: Jun. 20, 2017

(54) DETECTION OF COIL COUPLING IN AN INDUCTIVE CHARGING SYSTEM

(71) Applicant: Apple Inc., Cupertino, CA (US)

(72) Inventors: Todd K. Moyer, Cupertino, CA (US); Chad A. Bossetti, Cupertino, CA (US); Jeffrey J. Terlizzi, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 70 days.

(21) Appl. No.: 14/304,064

(22) Filed: Jun. 13, 2014

(51) Int. Cl.
*H02J 7/00* (2006.01)
*H02J 7/02* (2016.01)
*G01R 31/315* (2006.01)

(52) U.S. Cl.
CPC ............ *H02J 7/025* (2013.01); *G01R 31/315* (2013.01)

(58) Field of Classification Search
USPC ........................................ 320/104, 108, 162
See application file for complete search history.

(56) References Cited

U.S. PATENT DOCUMENTS

| | | | |
|---|---|---|---|
| 4,268,899 A | 5/1981 | Rokas | |
| 5,293,308 A | 3/1994 | Boys et al. | |
| 5,639,989 A | 6/1997 | Higgins, III | |
| 6,960,968 B2 | 11/2005 | Odendaal et al. | |
| 6,972,543 B1 | 12/2005 | Wells | |
| 7,641,358 B1 | 1/2010 | Smith et al. | |
| 7,948,208 B2 | 5/2011 | Partovi et al. | |
| 7,952,322 B2 | 5/2011 | Partovi et al. | |
| 8,024,491 B1 | 9/2011 | Wright et al. | |
| 8,054,651 B2 | 11/2011 | Pollard | |
| 8,169,151 B2 | 5/2012 | Kimura | |
| 8,169,185 B2 | 5/2012 | Partovi et al. | |
| 8,274,178 B2 | 9/2012 | Tucker | |
| 8,278,784 B2 | 10/2012 | Cook et al. | |
| 8,362,744 B2 | 1/2013 | Terao et al. | |
| 8,421,274 B2 | 4/2013 | Sun et al. | |
| 8,629,652 B2 | 1/2014 | Partovi et al. | |
| 8,629,654 B2 | 1/2014 | Partovi et al. | |
| 8,810,071 B2 | 8/2014 | Sauerlaender et al. | |
| 8,884,469 B2 | 11/2014 | Lemmens | |
| 8,947,047 B2 | 2/2015 | Partovi et al. | |
| 9,018,904 B2 | 4/2015 | Seyerle et al. | |
| 9,030,421 B2 | 5/2015 | Tseng et al. | |
| 9,106,083 B2 | 8/2015 | Partovi | |
| 9,112,362 B2 | 8/2015 | Partovi | |

(Continued)

FOREIGN PATENT DOCUMENTS

CN 1826715 8/2006
CN 102124624 7/2011
(Continued)

OTHER PUBLICATIONS

U.S. Appl. No. 15/179,922, filed Jun. 10, 2016, Lynch.

*Primary Examiner* — Brian Ngo
(74) *Attorney, Agent, or Firm* — Brownstein Hyatt Farber Schreck, LLP

(57) ABSTRACT

An inductive charging system can include a transmitter device and a receiver device. The transmitter device may be adapted to detect when a receiver coil in the receiver device is coupled to a transmitter coil in the transmitter device. For example, the current input into a DC-to-AC converter in the transmitter device can be measured and coil coupling detected when the current equals or exceeds a threshold value.

18 Claims, 6 Drawing Sheets

(56) References Cited

U.S. PATENT DOCUMENTS

| | | | |
|---|---|---|---|
| 9,112,363 B2 | 8/2015 | Partovi | |
| 9,112,364 B2 | 8/2015 | Partovi | |
| 9,124,112 B2 | 9/2015 | Havass et al. | |
| 9,126,490 B2 | 9/2015 | Cook | |
| 9,148,201 B2 | 9/2015 | Kallal et al. | |
| 9,154,189 B2 | 10/2015 | Von Novak et al. | |
| 9,160,180 B2 | 10/2015 | Suzuki et al. | |
| 9,178,369 B2 | 11/2015 | Partovi | |
| 9,197,065 B2 | 11/2015 | Divan et al. | |
| 9,197,070 B2 | 11/2015 | Jung | |
| 9,231,411 B2 | 1/2016 | Baarman et al. | |
| 9,270,138 B2 | 2/2016 | Yamakawa et al. | |
| 9,276,437 B2 | 3/2016 | Partovi et al. | |
| 9,318,915 B2 | 4/2016 | Miller et al. | |
| 9,352,661 B2 | 5/2016 | Keeling et al. | |
| 9,356,659 B2 | 5/2016 | Partovi | |
| 9,407,107 B2 | 8/2016 | Park et al. | |
| 9,460,846 B2 | 10/2016 | Graham et al. | |
| 9,496,731 B2 | 11/2016 | Park et al. | |
| 9,537,353 B1 | 1/2017 | Bossetti et al. | |
| 2010/0066261 A1* | 3/2010 | Kimura | H05B 41/2827 315/246 |
| 2010/0109443 A1* | 5/2010 | Cook | H01Q 1/2225 307/104 |
| 2010/0328044 A1 | 12/2010 | Waffenschmidt et al. | |
| 2011/0050164 A1 | 3/2011 | Partovi et al. | |
| 2011/0109264 A1 | 5/2011 | Choi | |
| 2011/0136550 A1 | 6/2011 | Maugars | |
| 2011/0198937 A1* | 8/2011 | Tseng | H02J 5/005 307/104 |
| 2011/0221385 A1 | 9/2011 | Partovi | |
| 2011/0234012 A1 | 9/2011 | Yi et al. | |
| 2011/0241615 A1* | 10/2011 | Yeh | H02J 7/0027 320/108 |
| 2011/0254379 A1 | 10/2011 | Madawala | |
| 2011/0291491 A1* | 12/2011 | Lemmens | H02J 5/005 307/104 |
| 2012/0068550 A1 | 3/2012 | De Boer et al. | |
| 2012/0146576 A1 | 6/2012 | Partovi | |
| 2012/0161696 A1* | 6/2012 | Cook | B60L 11/182 320/108 |
| 2012/0313577 A1 | 12/2012 | Moes et al. | |
| 2013/0076648 A1 | 3/2013 | Krah et al. | |
| 2013/0093388 A1 | 4/2013 | Partovi | |
| 2013/0093389 A1 | 4/2013 | Partovi | |
| 2013/0099563 A1 | 4/2013 | Partovi et al. | |
| 2013/0099735 A1 | 4/2013 | Partovi | |
| 2013/0154554 A1* | 6/2013 | Sakai | H02J 7/025 320/108 |
| 2013/0234532 A1 | 9/2013 | Fells et al. | |
| 2013/0249479 A1* | 9/2013 | Partovi | H02J 7/025 320/108 |
| 2013/0257168 A1 | 10/2013 | Singh | |
| 2013/0260677 A1 | 10/2013 | Partovi | |
| 2013/0271069 A1 | 10/2013 | Partovi | |
| 2013/0285604 A1 | 10/2013 | Partovi | |
| 2013/0285605 A1 | 10/2013 | Partovi | |
| 2013/0300204 A1 | 11/2013 | Partovi | |
| 2014/0015327 A1 | 1/2014 | Keeling et al. | |
| 2014/0015522 A1* | 1/2014 | Widmer | G01D 5/2006 324/239 |
| 2014/0035378 A1 | 2/2014 | Kesler et al. | |
| 2014/0103873 A1 | 4/2014 | Partovi et al. | |
| 2014/0132210 A1 | 5/2014 | Partovi | |
| 2014/0159656 A1* | 6/2014 | Riehl | H01F 38/14 320/108 |
| 2014/0191568 A1 | 7/2014 | Partovi | |
| 2014/0191818 A1* | 7/2014 | Waffenschmidt | H02J 7/025 333/17.1 |
| 2014/0197687 A1 | 7/2014 | Lin | |
| 2014/0197782 A1 | 7/2014 | Graf et al. | |
| 2014/0225439 A1* | 8/2014 | Mao | H02M 3/3376 307/31 |
| 2014/0266018 A1 | 9/2014 | Carobolante | |
| 2014/0306654 A1 | 10/2014 | Partovi | |
| 2014/0320090 A1* | 10/2014 | Keeling | H02J 5/005 320/162 |
| 2014/0347007 A1 | 11/2014 | Kee et al. | |
| 2015/0001950 A1 | 1/2015 | Chung et al. | |
| 2015/0035372 A1 | 2/2015 | Aioanei | |
| 2015/0077046 A1* | 3/2015 | Huang | H02J 50/05 320/108 |
| 2015/0130412 A1 | 5/2015 | Partovi | |
| 2015/0207333 A1* | 7/2015 | Baarman | H02J 17/00 307/104 |
| 2015/0215006 A1 | 7/2015 | Mehas et al. | |
| 2015/0244179 A1 | 8/2015 | Ritter et al. | |
| 2015/0244341 A1 | 8/2015 | Ritter et al. | |
| 2015/0270058 A1 | 9/2015 | Golko et al. | |
| 2015/0280455 A1 | 10/2015 | Bosshard et al. | |
| 2015/0333530 A1* | 11/2015 | Moyer | H02J 7/025 307/104 |
| 2015/0349538 A1 | 12/2015 | Agostinelli et al. | |
| 2015/0364931 A1 | 12/2015 | Ren et al. | |
| 2016/0043567 A1 | 2/2016 | Matumoto et al. | |
| 2016/0056664 A1 | 2/2016 | Partovi | |
| 2016/0064948 A1 | 3/2016 | Heresztyn et al. | |
| 2016/0064992 A1 | 3/2016 | Herbst et al. | |
| 2016/0172894 A1 | 6/2016 | Khripkov et al. | |
| 2016/0261137 A1 | 9/2016 | Riehl | |
| 2016/0285278 A1 | 9/2016 | Mehas et al. | |
| 2017/0012463 A1 | 1/2017 | Lynch | |
| 2017/0110911 A1 | 4/2017 | Bossetti et al. | |

FOREIGN PATENT DOCUMENTS

| | | |
|---|---|---|
| CN | 102257696 | 11/2011 |
| CN | 102355035 | 2/2012 |
| CN | 202712982 | 1/2013 |
| CN | 103019485 | 4/2013 |
| CN | 202976038 | 6/2013 |
| CN | 103326475 | 9/2013 |
| CN | 103457362 | 12/2013 |
| CN | 103518175 | 1/2014 |
| CN | 103765722 | 4/2014 |
| CN | 103812162 | 5/2014 |
| CN | 103999320 | 8/2014 |
| EP | 2642628 | 9/2013 |
| GB | 2484999 | 5/2012 |
| JP | H08331850 | 12/1996 |
| JP | 2010161882 | 7/2010 |
| JP | 2013115929 | 6/2013 |
| JP | 2013183497 | 9/2013 |
| JP | 2013536664 | 9/2013 |
| JP | 2014193087 | 10/2014 |
| KR | 20130055199 | 5/2013 |
| KR | 20140061337 | 5/2014 |
| WO | WO 2010/077991 | 7/2010 |
| WO | WO 2010/108191 | 9/2010 |
| WO | WO 2011/156555 | 12/2011 |
| WO | WO 2012/085119 | 6/2012 |
| WO | WO 2016/024869 | 2/2016 |

\* cited by examiner

DETECTION OF COIL COUPLING IN AN INDUCTIVE CHARGING SYSTEM

TECHNICAL FIELD

The invention relates generally to inductive charging systems, and more particular to detecting coil coupling in an inductive charging system.

BACKGROUND

Many electronic devices include one or more rechargeable batteries that require external power to recharge from time to time. Often, these devices may be charged using a similar power cord or connector, for example a universal serial bus ("USB") connector. However, despite having common connection types, devices often require separate power supplies with different power outputs. These multiple power supplies can be burdensome to use, store, and transport from place to place. As a result, the benefits of device portability may be substantially limited.

Furthermore, charging cords may be unsafe to use in certain circumstances. For example, a driver of a vehicle may become distracted attempting to plug an electronic device into a vehicle charger. In another example, a charging cord may present a tripping hazard if left unattended.

To account for these and other shortcomings of portable electronic devices, some devices include an inductive charging system. The user may simply place the device on an inductive charging surface of a charging device in order to charge the battery. The charging device can detect the presence of the electronic device on the inductive charging surface by pinging or transmitting power to the electronic device for a given time period and waiting to receive a response (e.g., a communication signal) from the electronic device. If the electronic device is not on the inductive charging surface, a response is not received from the electronic device and the charging device stops pinging. The charging device may then ping periodically until a communication signal is received from the electronic device.

Periodic pinging, however, consumes power and can reduce the charge on the battery. For example, if the electronic device is not present for twelve hours, periodic pinging can consume power needlessly. The time interval between pings can be increased to save power, but this slows the response time of the charging device. For example, the charging device can ping every minute, but up to a minute can pass before the charging device responds by transmitting power to the electronic device.

SUMMARY

In one aspect, a receiver device for use in an inductive charging system can include a receiver coil operatively connected to an input of an AC-to-DC converter, a first resonant circuit operatively connected in series between the receiver coil and the input of the AC-to-DC converter, and a second resonant circuit operatively connected in parallel with the receiver coil between the receiver coil and the input to the AC-to-DC converter. A load may be operatively connected to an output of the AC-to-DC converter. As one example, the load can be a rechargeable battery. The first resonant circuit is associated with a first resonant frequency and the second resonant circuit is associated with a second resonant frequency that is different from the first resonant frequency. In one embodiment, the second resonant frequency is higher than the first resonant frequency.

In another aspect, a switch may be operatively connected in series with the second resonant circuit in the receiver device. A processing device in the receiver device can control the state of the switch. The switch can be used to communicate with the transmitter device. As one example, the switch can be opened when the receiver device is to be "cloaked" or not in communication with the transmitter device, even when the receiver coil is able to couple with the transmitter coil (e.g., the receiver device is on the charging surface). As one example, the transmitter device can transfer energy to the receiver device to charge a battery in the receiver device. The switch is closed while the battery is charging. The switch can be opened when the battery is charged fully to inform the transmitter device to stop transferring energy. The transmitter device may then enter a low power or sleep state in response to the open state of the switch.

In another aspect, a method for detecting coupling between a receiver coil and a transmitter coil in an inductive power transfer system can include a transmitter device transmitting pings to a receiver device at different frequencies and measuring a current input into a DC-to-AC converter in the transmitter device based on each ping. The current measurements can then be analyzed to determine whether a current measurement indicates the receiver coil and the transmitter coil are inductively coupled. As one example, the current input into the DC-to-AC converter can be higher when the receiver and transmitter coils are coupled than when the receiver and transmitter coils are not coupled.

In yet another aspect, a receiver in an inductive charging system can include a resonant circuit connected in parallel with a receiver coil. A switch can be connected in series with the resonant circuit. A method for operating a transmitter device can include the transmitter device transferring energy to the receiver device when the switch is closed, and the transmitter device responsively taking a different action when the switch is open. In one embodiment, the different action can include the transmitter device entering a low power state when the switch is open. Additionally or alternatively, the different action may include the transmitter device periodically transmitting one or more pings to the receiver device.

In another aspect, an inductive charging system can include a transmitter device and a receiver device. The transmitter device can include a current sense operatively connected between an output of a power supply and an input of a DC-to-AC converter. A method for operating the inductive charging system can include detecting a change in a current that is input into the DC-to-AC converter and transferring energy based on the current change. The energy transfer can stop when a response is not received from a receiver device. One or more operations in the transmitter device can be adaptively adjusted based on not receiving a response from the receiver device. For example, the time interval between pings can be increased.

BRIEF DESCRIPTION OF THE DRAWINGS

Embodiments of the invention are better understood with reference to the following drawings. The elements of the drawings are not necessarily to scale relative to each other. Identical reference numerals have been used, where possible, to designate identical features that are common to the figures.

DETAILED DESCRIPTION

Embodiments described herein can transfer energy inductively from a transmitter device to a receiver device to charge a battery or to operate the receiver device. Additionally or alternatively, communication or control signals can be transmitted to the receiver device through the inductive coupling between the transmitter and receiver coils. For example, while charging, high frequency pulses can be added on top of the inductive charging frequency to enable both charging and communication. Alternatively, the transferred energy can be used solely for communication. Thus, the terms "energy", "signal", or "signals" are meant to encompass transferring energy for wireless charging, transferring energy as communication and/or control signals, or both wireless charging and the transmission of communication and/or control signals.

Figure 1:
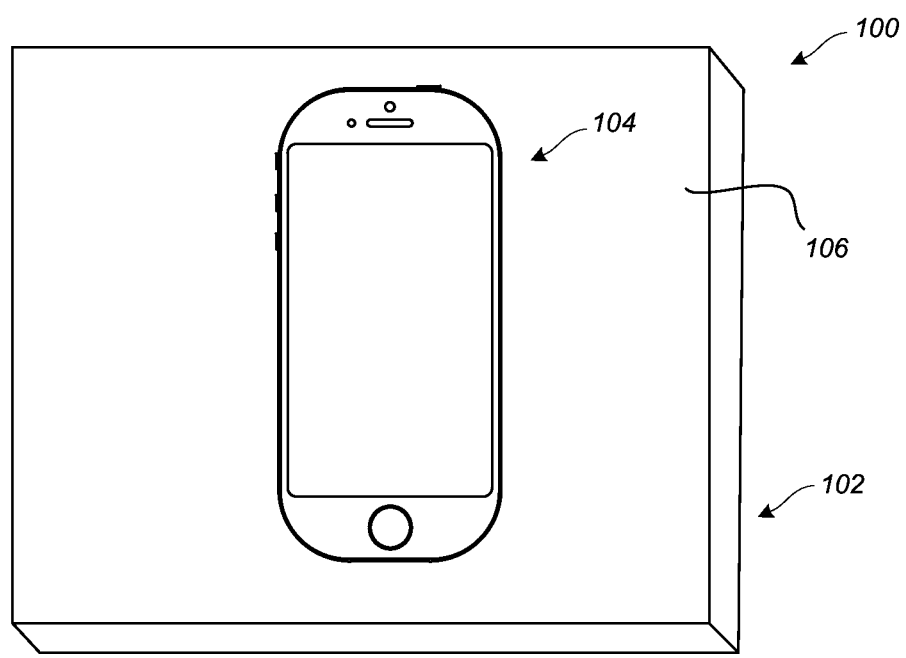
FIG. 1 illustrates one example of inductive charging system.

Referring now to FIG. 1, there is shown a top view of one example of an inductive charging system. The inductive charging system 100 includes a charging device 102 and an electronic device 104. In the illustrated embodiment, the charging device 102 is depicted as a charging dock and the electronic device as a smart telephone. The electronic device and/or the charging device can be implemented as different devices in other embodiments. For example, the electronic device 104 can be a digital media player, a wearable electronic or communication device, a health monitoring device, a tablet computing device, and any other type of electronic device that includes one or more inductive charging coils. As another example, the charging device 102 may be adapted to be inserted into a charging port in an electronic device.

To transfer energy to the electronic device 104, the electronic device 104 is placed on a charging surface 106 of the charging dock 102. The charging dock 102 may be connected to a power source (e.g., a wall outlet) through a power cord or connector (not shown). The charging dock 102 includes one or more inductive charging coils that transfer signals or energy to one or more inductive charging coils in the electronic device 104. Energy can be transferred, for example, to charge a battery in the electronic device 104 or to operate the electronic device. Additionally or alternatively, control and/or communication signals can be transferred wirelessly between the charging dock 102 and the electronic device 104. Thus, in the illustrated embodiment the charging dock 102 is a transmitter device with a transmitter coil or coils and the portable electronic device 104 is a receiver device with one or more receiver coils.

Figure 2:
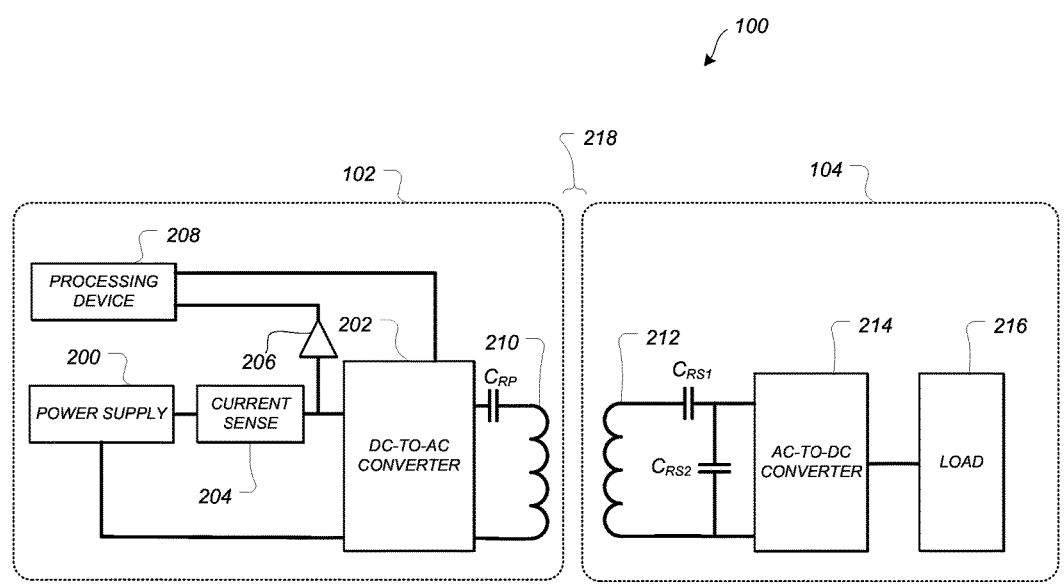
FIG. 2 depicts a simplified block diagram of one example of the inductive charging system 100 shown in FIG. 1.

FIG. 2 depicts a simplified block diagram of one example of the inductive charging system 100 shown in FIG. 1. The charging device 102 includes a power supply 200 operably connected to a DC-to-AC converter 202. Any suitable type of a DC-to-AC converter may be used in one or more embodiments. For example, the DC-to-AC converter is constructed as an H bridge in one embodiment.

An input of a current sense circuit 204 is connected to an output of the power supply 200, and the output of the current sense circuit 204 is connected to an input of the DC-to-AC converter 202. An input of an amplifier 206 is operably connected to an output of the current sense circuitry 204, and the output of the amplifier 206 is operably connected to a processing device 208. The processing device can be implemented as any electronic device capable of processing, receiving, or transmitting data or instructions. For example, the processing device 208 can be a microprocessor, a central processing unit (CPU), an application-specific integrated circuit (ASIC), a digital signal processor (DSP), or combinations of multiple such devices. As described herein, the term "processing device" is meant to encompass a single processor or processing unit, multiple processors, multiple processing units, or other suitably configured computing element or elements.

The processing device 208 may also be operably connected to the DC-to-AC converter 202. The processing device 208 can control the operation of the DC-to-AC converter 202 in some embodiments. The output of the DC-to-AC converter 202 is operably connected to the transmitter coil 210.

The electronic device 104 can include a receiver coil 212 operably connected to an AC-to-DC converter 214. Any suitable type of AC-to-DC converter may be used in one or more embodiments. For example, the AC-to-DC converter is constructed as a diode bridge in one embodiment. A load 216 is operably connected to the output of the AC-to-DC converter 214. The load 216 is a rechargeable battery in one embodiment. A different type of load can be used in other embodiments.

The transmitter coil 210 and the receiver coil 212 together form a transformer 218. The transformer 218 transfers energy through inductive coupling between the transmitter coil 210 and the receiver coil 212. Essentially, energy is transferred from the transmitter coil 210 to the receiver coil 212 through the creation of a varying magnetic flux by the AC signal in the transmitter coil 210 that induces a current in the receiver coil 212. The AC signal induced in the receiver coil 212 is received by the AC-to-DC converter 214 that converts the AC signal into a DC signal. In embodiments where the load 122 is a rechargeable battery, the DC signal is used to charge the battery.

In some embodiments, the leakage inductance of the transformer 218 can be significant. Resonant circuits may be included in the inductive charging system 100 to cancel some or all of the leakage inductance when the capacitance and inductance values are near the resonant frequency ($f_{R1}$). In the illustrated embodiment, the resonant circuit in the transmitter device 102 is a resonant capacitor $C_{RP}$ connected in series between the DC-to-AC converter 202 and the transmitter coil 210. The resonant circuit in the receiver device 104 is a resonant capacitor $C_{RS1}$ connected in series between the receiver coil 212 and the AC-to-DC converter 214.

In some embodiments, the transmitter device 102 may scan the environment to detect the presence of the receiver device 104 when the transmitter device is not inductively coupled to the receiver device (e.g., not transferring energy to the receiver device). To scan the environment, the transmitter device 102 can transfer a short burst of energy to the receiver device 104 to determine if the receiver coil 212 is coupled to the transmitter coil 210. This short burst of energy is known as a ping. The transmitter device 102 may transmit a ping and wait for a response from the receiver device 104. If no response is received, the transmitter device 102 waits for a given period of time before sending another ping. If a response is received, the transmitter device 102 can transfer energy to the receiver device 104 to charge a battery and/or to transmit one or more communication signals to the receiver device 104.

In some embodiments, a second resonant circuit is included in the receiver device 104 to reduce the amount of power consumed by the transmitter coil 210 when transmitting pings. In the illustrated embodiment, the second resonant circuit is a second resonant capacitor $C_{RS2}$ connected in parallel with the receiver coil 212 between the receiver coil and the AC-to-DC converter 214. The second resonant circuit can have a resonant frequency ($f_{R2}$) that is higher than the resonant frequency ($f_{R1}$) of the first resonant circuits $C_{RP}$ and $C_{RS1}$. In other words, $f_{R1} < f_{R2}$. As one example, the lower first resonant frequency approximately 250 kHz and the second higher resonant frequency ($f_{R2}$) can be in the range of 750 kHz to 1 MHz. Other embodiments can operate at different frequencies and/or frequency ranges.

Other embodiments can configure the resonant circuits differently. The resonant circuits can include additional or different components. The resonant circuits can be included at different locations or connected in a different circuit configuration within the transmitter and/or receiver device.

The transmitter coil 210 can be energized at the higher second resonant frequency ($f_{R2}$) when transmitting a ping and draw relatively low current when the inductance of the transmitter coil is low. At the higher second resonant frequency the impedance of the transmitter coil 210 is higher and the transmitter coil does not consume as much power when transmitting pings.

When the pings are transmitted at the second resonant frequency, the transmitter device 102 can determine whether the receiver coil 212 is coupled to the transmitter coil 210 by measuring the current input into the DC-to-AC converter 202. When the receiver coil 212 is coupled to the transmitter coil 210, a higher current can be input into the DC-to-AC converter than when the receiver coil 212 is not coupled to the transmitter coil 210. The processing device 208 can receive current measurements from the current sense circuit 204 and based on an analysis or review of the current measurements, determine whether the receiver coil 212 is coupled to the transmitter coil 210.

Figure 3:
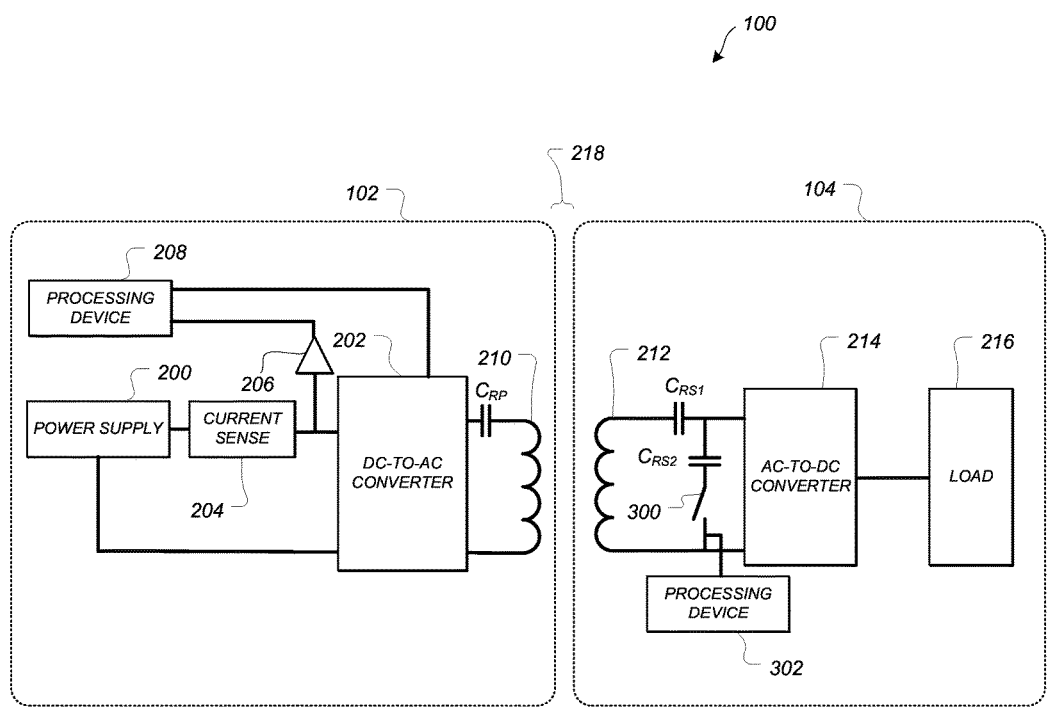
FIG. 3 depicts a simplified block diagram of another example of the inductive charging system 100 shown in FIG. 1.

Referring now to FIG. 3, there is shown a simplified block diagram of another example of the inductive charging system 100 shown in FIG. 1. The inductive charging system is similar to the embodiment shown in FIG. 2 except for the switch 300 connected in series with the second resonant capacitor $C_{RS2}$. Any suitable type of switch can be used. In some embodiments, a processing device 302 can control the state of the switch 300 (i.e., open or closed). Like the processing device 208 in FIG. 2, the processing device 302 can be implemented as any electronic device capable of processing, receiving, or transmitting data or instructions.

The switch 300 can be used by the receiver device to communicate with the transmitter device. As one example, the switch can be opened when the receiver device 104 is to be "cloaked" or not in communication with the transmitter device 102, even when the receiver coil is able to couple with the transmitter coil (e.g., the receiver device is on the charging surface). As one example, the transmitter device 102 can transfer energy to the receiver device 104 to charge a battery (e.g., load 216) in the receiver device. The switch 300 is closed while the battery is charging. The switch can be opened when the battery is charged fully to inform the transmitter device 102 to stop transferring energy. The transmitter device 102 may enter a low power or sleep state in response to the open state of the switch 300. The transmitter device 102 can wake up periodically to transmit a ping to the receiver device 104. If the switch 300 is closed, the processing device 208 in the transmitter device 102 can detect the receiver device based on one or more current measurements received from the current sense circuit 204.

In some embodiments, the resonant frequency can vary due various reasons, such as manufacturing tolerances and coupling differences between different receiver and transmitter coils. As one example, the resonant frequency can vary up to 50 kHz. Thus, in some embodiments, the transmitter device can sweep or scan a given range of frequencies to determine a frequency at which a maximum current is input into the DC-to-AC converter. For example, a higher resonant frequency can be set to 1 MHz, and the transmitter device may scan a frequency range of 800 kHz to 1.2 MHz.

Figure 4:
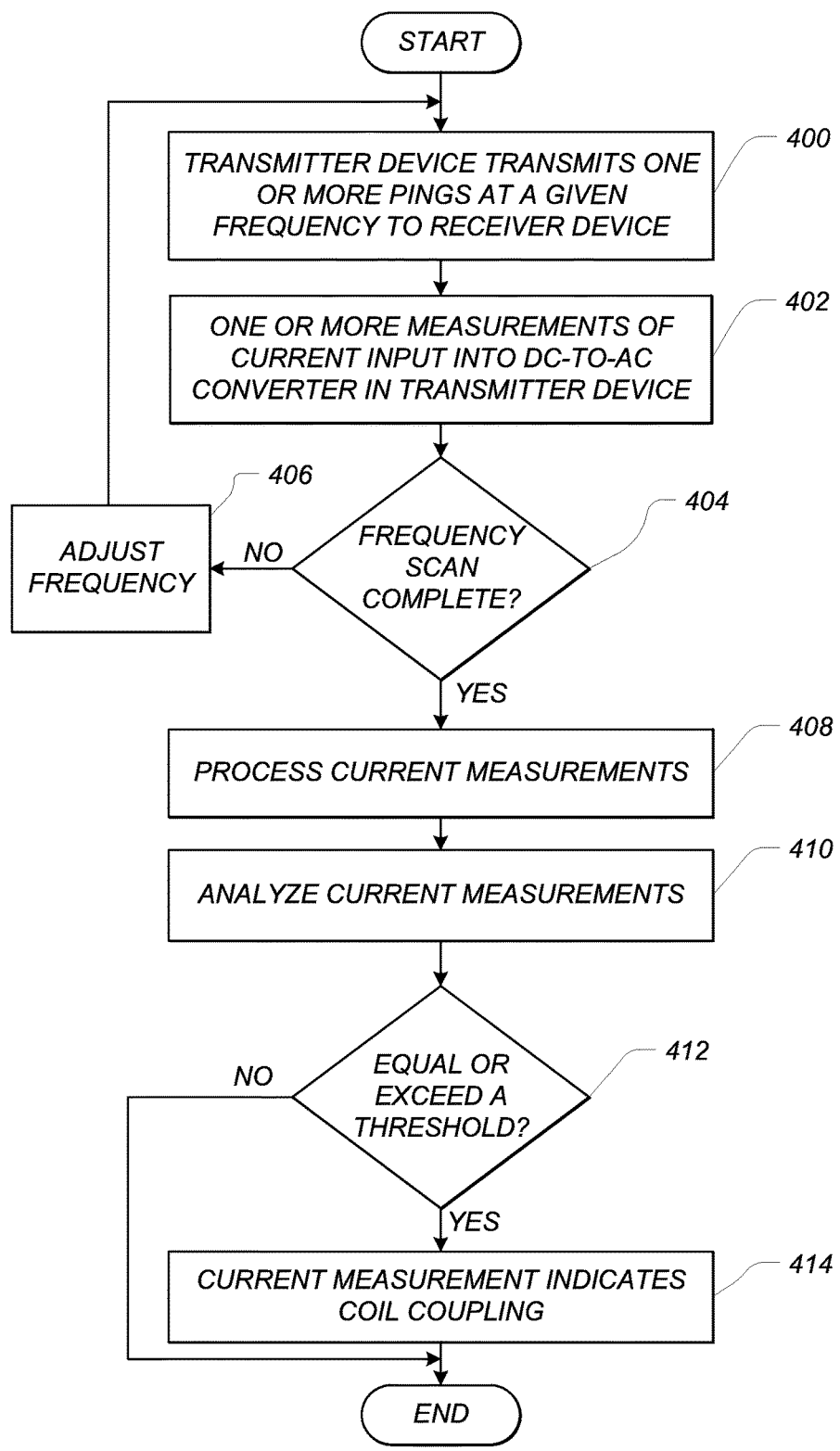
FIG. 4 is a flowchart of a method for scanning a frequency range to detect coil coupling.

FIG. 4 is a flowchart of a method for scanning a frequency range to detect coil coupling. Initially, the transmitter device transmits one or more pings to a receiver device at a given frequency and the current input into the DC-to-AC converter in the transmitter device is measured (blocks 400 and 402). A determination may then be made at block 404 as to whether or not the frequency scan is complete. If not, the process can pass to block 406 where the frequency is adjusted. The method returns to block 400 and repeats until the frequency scan is complete.

When the frequency scan is complete, the current measurements can optionally be processed at block 408. As one example, if multiple current measurements are taken at each frequency, the current measurements measured at a particular frequency can be averaged together. The current measurements are then analyzed at block 410. A determination can be made at block 412 as to whether or not a current measurement equals or exceeds a threshold value. The threshold value can be a minimum or expected current measurement that indicates the receiver coil is coupled to the transmitter coil. The method may end if a current measurement does not equal or exceed the threshold value. Coupling between a transmitter and receiver coil is indicated when a current measurement equals or exceeds the threshold value (block 414) and the method ends.

Figure 5:
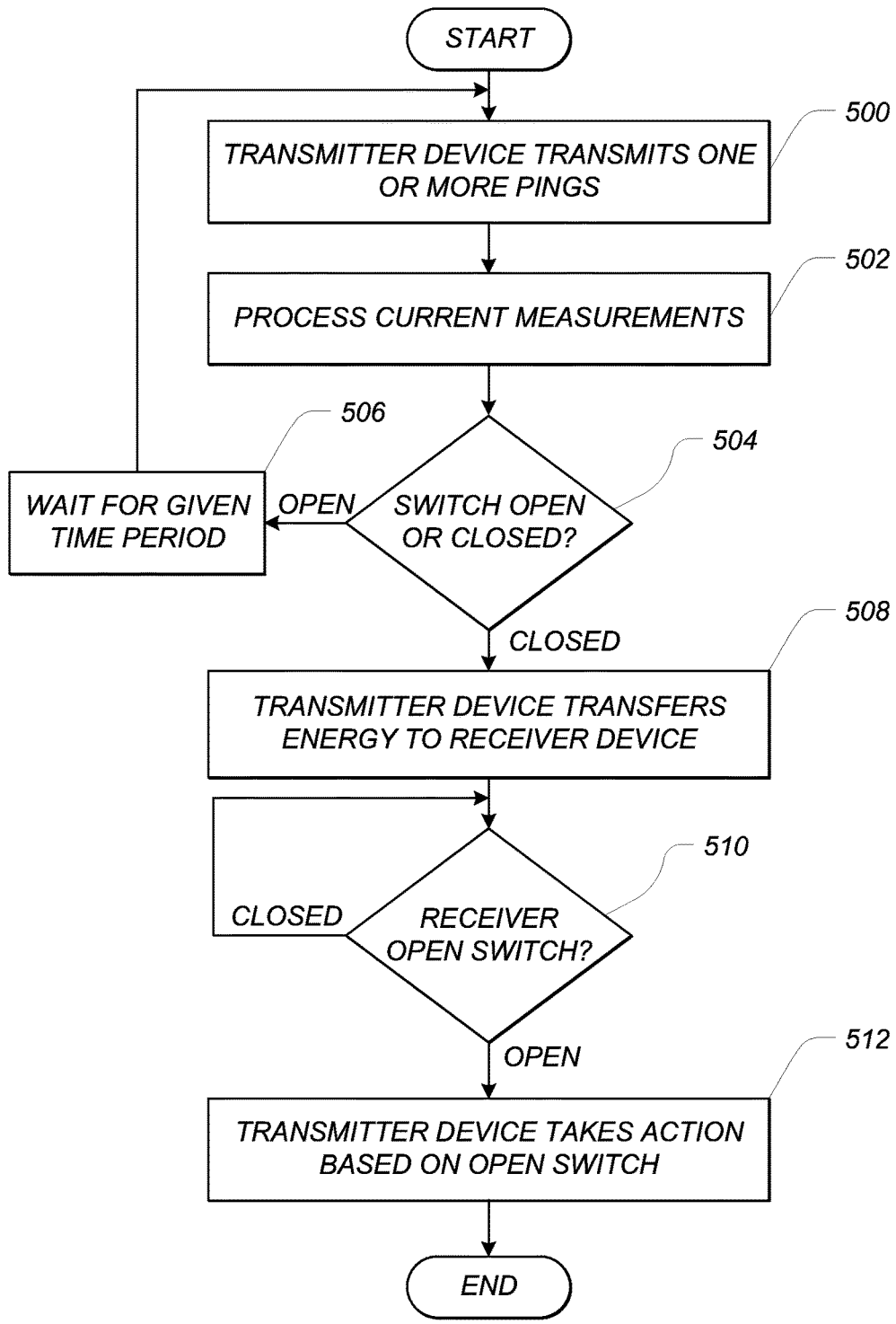
FIG. 5 is a flowchart of one method for operating an inductive charging system.

Referring now to FIG. 5, there is shown a flowchart of one method for operating an inductive charging system. Initially, the transmitter device can transmit one or more pings to the receiver device (block 500). The current measurements can optionally be processed at block 502. As one example, if multiple current measurements are taken at a particular frequency, the current measurements can be averaged together.

A determination may then be made at block 504 as to whether or not the switch (i.e., switch 300 in FIG. 3) in the receiver device is open or closed. If the switch is open, the process can pass to block 506 where the transmitter device waits for a given period of time. The method may then return to block 500 and repeat until the transmitter detects the switch is closed.

When the switch is closed, the process continues at block 508 where the transmitter device can transmit energy to the receiver device. The transferred energy can be used to charge a battery in the receiver device, to operate the receiver device, and/or to transmit control or communication signals to the receiver device. A determination may then be made at block 510 as to whether or not the switch remains closed or has been opened. If the switch remains closed, the method can check the state of the switch continuously, periodically, or at select times. When the switch is opened, the process may pass to block 512 where the transmitter device can take one or more actions based on the open state of the switch. For example, in one embodiment, the transmitter device may enter a low power state, such as a sleep state or an off state.

Figure 6:
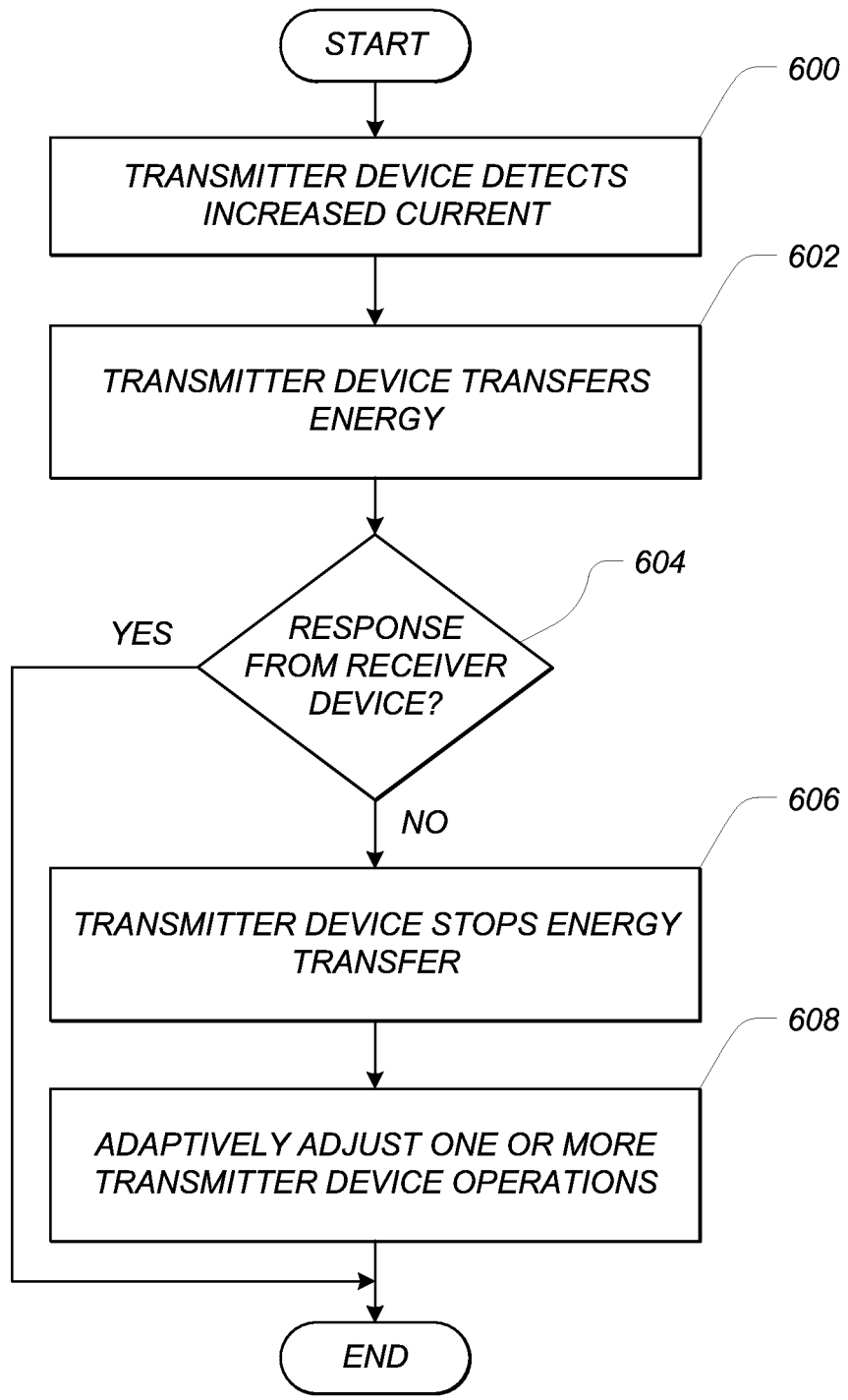
FIG. 6 is a flowchart of another method for operating an inductive charging system.

FIG. 6 is a flowchart of another method for operating an inductive charging system. In one embodiment, this method can be used to distinguish between a foreign object and a receiver device positioned on a charging surface of the transmitter device. Initially, the transmitter device may detect an increase in the current that is input into the DC-to-AC converter at block 600. The increased current can initially be interpreted as a receiver coil coupling with the transmitter coil in the receiver device. Based on the increased current and the preliminary interpretation, the transmitter device can begin transferring energy at block 602. A determination is then made at block 604 as to whether or not a response is received from a receiver device. The method ends if a response is received from a receiver device.

When a response is not received, the transmitter device can change the initial interpretation and assume a receiver coil is not coupled to the transmitter coil and responsively stop the transfer of energy (block 606). The transmitter device may then adjust one or more operations based on the lack of a response. For example, in one embodiment, the transmitter device may increase the time interval between pings to save power. Additionally or alternatively, the threshold value for indicating coil coupling (see block 412 in FIG. 4) can be adjusted (e.g., increased). Different actions may be taken in other embodiments.

The flowcharts in FIGS. 4-6 can be performed differently in other embodiments. Blocks can be added, omitted, or re-order in some embodiments. In one example, block 408 in FIG. 4 can be omitted or block 408 can be performed before block 404. Block 502 in FIG. 5 can be omitted as another example.

Embodiments disclosed herein have been described with respect to the second resonant frequency being higher than the first resonant frequency, and the current input into the DC-to-AC converter in the transmitter device being a higher or increased current when indicating coil coupling. Other embodiments, however, are not limited to this implementation. In some embodiments, the second resonant frequency can be lower than the first resonant frequency ($f_{R1}>f_{R2}$), and when indicating coil coupling, the current input into the DC-to-AC converter can be a smaller or reduced current. In such embodiments, the current value that indicates coil coupling can be lower than a threshold value.

Various embodiments have been described in detail with particular reference to certain features thereof, but it will be understood that variations and modifications can be effected within the spirit and scope of the disclosure. And even though specific embodiments have been described herein, it should be noted that the application is not limited to these embodiments. In particular, any features described with respect to one embodiment may also be used in other embodiments, where compatible. Likewise, the features of the different embodiments may be exchanged, where compatible.

We claim:

1. A receiver device for use in an inductive charging system, comprising:
    a receiver coil operatively connected to an input of an AC-to-DC converter;
    a rechargeable battery operatively connected to an output of the AC-to-DC converter;
    a first resonant circuit operatively connected in series between the receiver coil and the input of the AC-to-DC converter, the first resonant circuit associated with a first resonant frequency;
    a second resonant circuit operatively connected in series across leads of the first resonant circuit, the second resonant circuit associated with a second resonant frequency that is different from the first resonant frequency; and
    a switch configured to:
        connect the second resonant circuit across the leads of the first resonant circuit when the receiver device is receiving power; and
        disconnect the second resonant circuit from the first resonant circuit when the rechargeable battery is fully charged.

2. The receiver device as in claim, further comprising a processing device for controlling a state of the switch.

3. The receiver device as in claim 1, further comprising a load operatively connected to an output of the AC-to-DC converter.

4. The receiver device as in claim 3, wherein the load comprises the rechargeable battery.

5. The receiver device as in claim 1, wherein the first and second resonant circuits each comprise a capacitor.

6. The receiver device as in claim 1, wherein the AC-to-DC converter comprises a four diode bridge circuit.

7. The receiver device as in claim 1, wherein the second resonant frequency is higher than the first resonant frequency.

8. A receiver device for use in an inductive charging system, comprising:
    a receiver coil operative to receive inductive power;
    a first resonant circuit operatively connected in series with the receiver coil and associated with a first resonant frequency; and
    a second resonant circuit coupling an output of the first resonant circuit to a lead of the receiver coil, the second resonant circuit associated with a second resonant frequency that is higher than the first resonant frequency; wherein: the second resonant circuit is associated with a low-power mode of a transmitter device coupled to the receiver device.

9. The receiver device of claim 8, further comprising an electronic switch connected in series with the second resonant circuit.

10. The receiver device of claim 9, wherein the electronic switch is configured to connect or disconnect the second resonant circuit from the receiver coil.

11. The receiver device of claim 9, wherein the first resonant circuit is configured to resonate with a third resonant circuit associated with the transmitter device.

12. The receiver device of claim 11, wherein the transmitter device comprises a coil coupled in series with the third resonant circuit.

13. The receiver device of claim 12, wherein the electronic switch disables the second resonant circuit to cloak the receiver device from the transmitter device.

14. A receiver device for use in a wireless charging system, the receiver device comprising:
    a processor;
    a rechargeable battery in communication with the processor;
    an inductive coil in communication with the processor and the rechargeable battery;
    a first capacitor connected in series with a first lead of inductive coil;

a second capacitor coupling an output lead of the first capacitor to a second lead of the inductive coil; and a switch connected in series with the second capacitor and in communication with the processor; wherein the processor is configured to send a signal to the switch to disconnect the second capacitor from the receiver coil when the rechargeable battery is charged beyond a threshold.

15. The receiver device of claim 14, further comprising a housing at least partially enclosing the processor and the inductive coil.

16. The receiver device of claim 14, wherein the first capacitor is configured to resonate at a first frequency with a third resonant circuit associated with a transmitter device.

17. The receiver device of claim 16, wherein the second capacitor is configured to resonant at a second frequency different from the first frequency.

18. The receiver device of claim 17, wherein the second frequency is greater than the first frequency.

\* \* \* \* \*